United States Patent
Kilbank

(10) Patent No.: US 7,212,974 B2
(45) Date of Patent: May 1, 2007

(54) SYSTEM AND METHOD FOR COMPRESSING AND ENCODING DATA

(76) Inventor: Daniel Kilbank, 8186 Inverness Ridge Rd., Potomac, MD (US) 20854

( * ) Notice: Subject to any disclaimer, the term of this patent is extended or adjusted under 35 U.S.C. 154(b) by 861 days.

(21) Appl. No.: 10/193,116

(22) Filed: Jul. 11, 2002

(65) Prior Publication Data
US 2003/0028387 A1 Feb. 6, 2003

Related U.S. Application Data

(60) Provisional application No. 60/304,074, filed on Jul. 11, 2001.

(51) Int. Cl.
*G10L 21/00* (2006.01)

(52) U.S. Cl. .................... 704/501; 704/503
(58) Field of Classification Search ............. 704/501, 704/503
See application file for complete search history.

(56) References Cited

U.S. PATENT DOCUMENTS

| | | |
|---|---|---|
| 3,784,832 A | 1/1974 | Sewell |
| 4,567,383 A | 1/1986 | Goto et al. |
| 4,879,488 A | 11/1989 | Silver |
| 4,890,282 A | 12/1989 | Lambert et al. |
| 4,897,854 A * | 1/1990 | Harris et al. ............... 375/286 |
| 4,903,018 A * | 2/1990 | Wiebach et al. ............ 341/51 |
| 5,051,993 A * | 9/1991 | DeLuca et al. ............. 370/310 |
| 5,182,642 A | 1/1993 | Gersdorff et al. |
| 5,398,030 A | 3/1995 | Sandell |
| 5,787,236 A | 7/1998 | Tucci |
| 5,917,322 A | 6/1999 | Gershenfeld et al. |
| 5,917,943 A | 6/1999 | Washizawa |
| 5,942,765 A | 8/1999 | Miyahara et al. |
| 6,006,105 A | 12/1999 | Rostoker et al. |
| 6,037,985 A | 3/2000 | Wong |
| 6,058,211 A | 5/2000 | Bormans et al. |
| 6,084,908 A | 7/2000 | Chiang et al. |
| 6,128,764 A | 10/2000 | Gottesman |
| 6,184,681 B1 | 2/2001 | Heidler et al. |
| 6,195,465 B1 | 2/2001 | Zandi et al. |
| RE37,222 E | 6/2001 | Yonemitsu et al. |
| 6,243,496 B1 | 6/2001 | Wilkinson |
| 6,246,430 B1 | 6/2001 | Peters et al. |
| 6,246,799 B1 | 6/2001 | Ebisawa |
| 6,456,994 B1 | 9/2002 | Tucci |
| 6,472,681 B1 | 10/2002 | Kane |
| 6,938,047 B2 * | 8/2005 | Kryeziu ..................... 707/101 |
| 2001/0025012 A1 | 9/2001 | Tarutani et al. |

(Continued)

OTHER PUBLICATIONS

Zhang et al., "Experiments on High-Speed All-Optical Code-Division Multiplexing Systems Using All-Serial Encoders and Decoders for $2^n$ Prime Code" IEEE Journal of Selected Topics in Quantum Electronics, vol. 5, No. 2, Mar./Apr. 1999.

*Primary Examiner*—Daniel Abebe
(74) *Attorney, Agent, or Firm*—Gottlieb Rackman & Reismar

(57) ABSTRACT

A system and method for compressing data into a single integrated strand of data is disclosed. The system includes an encoder, sequencer, compression engine, protocol stack and a broadcaster for use over existing networks and wireless systems. Using compression and encoding techniques, multiple strands of data are taken and compressed into a single integrated continuous or block stream. The data comes from multiple sources, such video, audio, or data, such text.

5 Claims, 3 Drawing Sheets

U.S. PATENT DOCUMENTS

| | | |
|---|---|---|
| 2002/0106084 A1 | 8/2002 | Azuma et al. |
| 2002/0139932 A1 | 10/2002 | Lofts |
| 2002/0181593 A1 | 12/2002 | Acharya et al. |
| 2003/0002670 A1 | 1/2003 | Wang |
| 2003/0093451 A1 | 5/2003 | Chuang et al. |
| 2004/0052373 A1 | 3/2004 | Debuisschert |
| 2004/0057526 A1 | 3/2004 | Debuisschert |
| 2004/0086039 A1 | 5/2004 | Reynolds et al. |

* cited by examiner

SYSTEM AND METHOD FOR COMPRESSING AND ENCODING DATA

CROSS REFERENCE TO RELATED APPLICATIONS

This application claims benefit from U.S. Provisional Patent Application Ser. No. 60/304,074, entitled "Multi-Frequency, Multi-Protocol, Multi-Standard Wireless, Wired Communication and Compression Device; Protocol Stack, Sequencer, Encoder, Decoder, and Player," filed Jul. 11, 2001, which is hereby incorporated by reference.

BACKGROUND OF THE INVENTION

1. Field of the Invention

The present invention relates to data compression and the transmission of data, and, more particularly, the invention relates to sending compressed and integrated data streams over communication channels.

2. Discussion of the Related Art

The transmission of data from one point to another is of increasing importance. From dial-up to broadband, users seek to receive more information in a quicker manner. Many of the constraints on speed and bandwidth lie in the inefficiencies of the systems and methods used in transmitting the data. Physical and practical constraints, however, also exist.

Further, consumer and user demands for larger data files are increasing. Communication systems should be able to send video, audio, text, and other data. Digital photos have become commonplace. Users routinely download videos, movies, and other files to view from remote locations. This process is convenient and easy, but also time consuming because of constraints on the data transmission capabilities of the communication system. In addition, constraints may occur when using plain old telephone systems ("POTS") in accessing networks and transmitting data. Future applications should try to overcome these constraints without requiring cost-prohibitive upgrades or replacing current infrastructure or systems.

SUMMARY OF THE INVENTION

Accordingly, the present invention is directed to a system and method for compressing data. The disclosed embodiments may include a hardware and/or software components within a portable plug-in device that couples current technologies with new protocol stacks and compression techniques. The disclosed embodiments may send compressed and integrated voice, video, and data bit stream information over current bandwidth allocations, such as 128 Kbits per second that allows for end user broadband speeds, such as 10 Mbytes per second. The disclosed embodiments may include an encoder, decoder, sequencer, compression engine, protocol stack, receiver, broadcaster, and player for the plug-in device and client side wired systems for use with existing television sets, telephone systems, and computer systems.

Additional features and advantages of the invention will be set forth in the disclosure that follows, and in part will be apparent from the description, or may be learned by practice of the invention. The objectives and other advantages of the invention will be realized and attained by the structure particularly pointed out in the written description and claims hereof as well as the appended drawings. According to the disclosed embodiments, a method for compressing data is disclosed. The method includes receiving a first data segment. The method also includes receiving a second data segment. The method also includes comparing the first data segment and the second data segment. The method also includes converting similar data in the first and the second data segment into powered data. The method also includes placing the powered data with other data into an integrated single strand of data.

According to the disclosed embodiments, a system for compressing data is disclosed. The system includes an encoder for coding data using an intelligent coding system and identifying the data according to a medium. The system also includes a compression engine for analyzing the coded data for similar data and putting the similar data in a powered form such that the coded data is converted into a single strand of data.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention. In the drawings.

DETAILED DESCRIPTION OF THE DISCLOSED EMBODIMENTS

Reference will now be made in detail to the disclosed embodiments of the present invention, examples of which are illustrated in the accompanying drawings.

Figure 1:
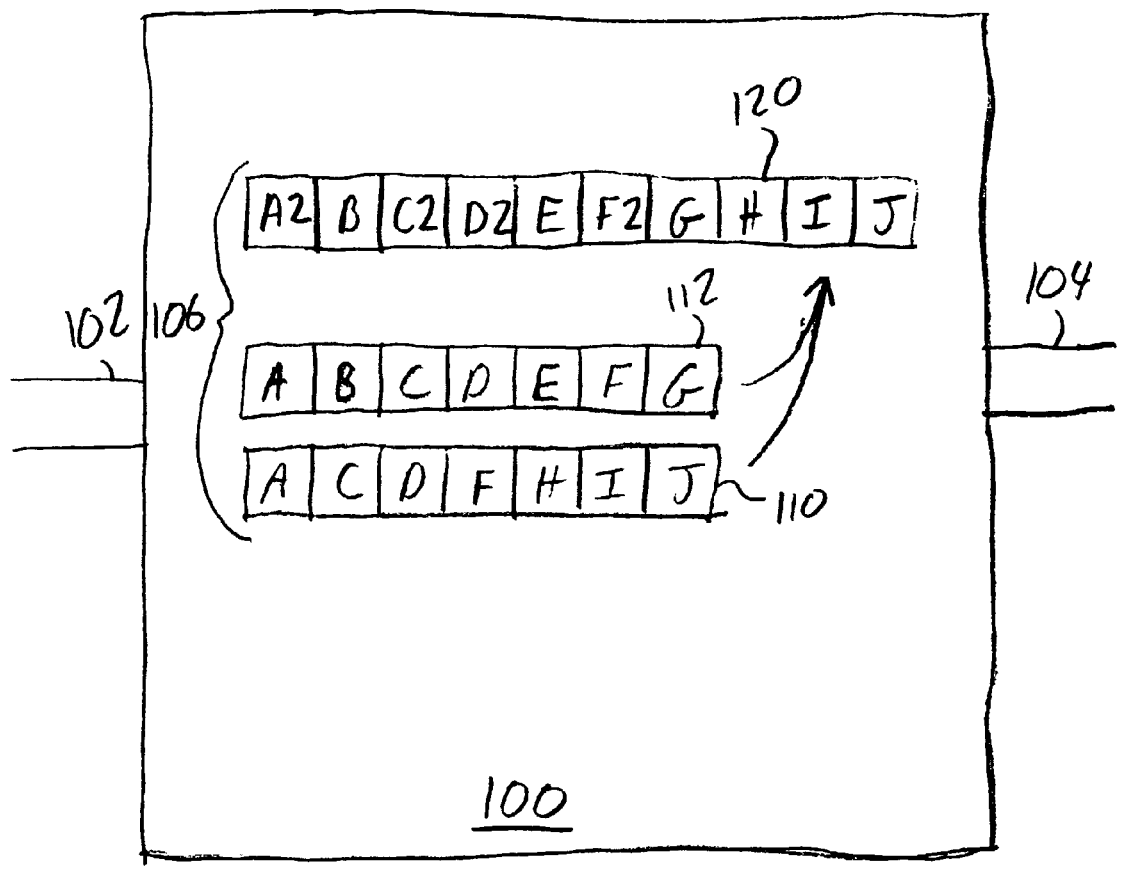
FIG. 1 illustrates a computational machine incorporating a compression algorithm according to the disclosed embodiments.

FIG. 1 depicts a compression device 100 incorporating a compression algorithm 106 according to the disclosed embodiments of the present invention. Compression device 100 may be any device, computer, machine, and the like that is able to execute instructions to perform functions. Preferably, compression device 100 compresses data that it receives via input data pipe 102. Compression device 100 may output the result of the compression operations via output data pipe 104. Data pipes 102 and 104 may be coupled to other machines, devices, computers and the like within a communication system.

Specifically, compression device 100 may be a communication device compatible with other communication devices, such as a wired or wireless device, including, but not limited to, cellular phones, personal digital assistants ("PDAs"), laptop computers, wireless computers, television sets, modems, telephones, and the like. Compression device 100 may be a peripheral plug-in device to supplement other communication devices. Preferably, the additional communication devices utilize communication standards and/or protocols, such as wired or radio frequency bandwidth.

Compression device 100, as disclosed above, may be in a network for transmitting data. Compression device 100 may include memory to store instructions, and at least one processor to execute the instructions. Compression device 100 may comprise hardware and software components, and may be portable such that compression device 100 may plug into existing communication devices. Compression device 100 may supplement existing communication devices by coupling technologies within the communication devices with protocol stacks and compression techniques, disclosed below.

Compression device 100 receives data from another device. The data may be previously compressed according to any known methods, such as MPEG. Alternatively, the received data may be non-compressed or new data. With the compression and encoding techniques in compression device 100, multiple strands of data may be taken and compresses into a single integrated continuous or block stream that is outputted through pipe 104.

For example, referring to FIG. 1, compression device receives data segments 110 and 112. Data segments 110 and 112 contain data in any of the forms disclosed above. Data segment 110 may include blocks A, B, C, F, H, I, and J. Data segment 112 may include blocks A, B, C, D, E, F, and G. Using algorithm operations 106, data segments 110 and 112 are compressed into integrated data segment 120.

According to the disclosed embodiments, subsequent data streams or segments are matched against the integrated data strand for similar data information, and then added to the integrated data strand in form of a powered number. For example, if the top data strand has text information that includes "the boy went to the store," and a subsequent data strand includes "the girl went to the store," then algorithm operations 106 takes the similar pieces of the subsequent strand and adds them to the first. The result may be "the2 boy went2 the2 store2."

The disclosed embodiments may group similar items into powers by associating numerical positions from the top strand of data with numerical positions for subsequent strands. Algorithm operations 106 may drop all the similar strings and further may compress the remaining information into similar characters by numerical position. Using the above example, there are 4 t's in the integrated strand that are squared because of the adoption of the subsequent strand. Algorithm operations 106 may take the relative position of the t's as they are represented in the integrated strand, and compress them to t8, thereby eliminating all of the redundant information. This encoding allows compression device 100 to specify numerical or position values to each line or data space to reconstruct the compressed data correctly.

Referring back to FIG. 1, algorithm operations 106 may combine data segments 110 and 112, as disclosed above. Some of the blocks in data segment 110 may be similar to blocks in data segment 112. Integrated data segment 120 may reflect the similar data blocks in powered form. Thus, integrated data segment 120 may comprise blocks A2, B, C2, D2, E, F2, G, H, I, and J. Integrated data segment 120 may be compressed further with subsequent data segments. Data segment 110 may come from one source such as audio, video and data. Data segment 120 may come from a different source.

Preferably, integrated data segment 120 is a single strand of data. Integrated data segment 120 should not be partitioned into blocks of data, but may be continuous. By compressing multiple data segments into a single strand of data, the total amount of bandwidth used for transmission may be reduced. Further, loss of data may be reduced as all data is compressed, or "rolled-up," into the single strand of data. Using the features disclosed above, the disclosed embodiments may rewrite and further encode data resulting from earlier processes. Data may be compressed into a pyramid, wherein the data is compressed into a single line of a continuous data feed. Further, the disclosed embodiments may take encoded data received by compression device 100 and assign the data into a predefined position in a defined integrated string of data.

The above-disclosed embodiments may use a looping action that allows large amounts of data to be processed at one time without overtaxing a processor within compression device 100. The disclosed embodiments may loop through the data, capturing all the data on a screen, picture, file, document, and the like. By looping, cache memory may be saved as information is stored or transmitted from the loop, and then dropped. The data being captured by the loop may be used to compare with incoming data.

The compression algorithm disclosed above includes several features. The algorithm provides compression with flat, low noise that may be dispersed throughout frequencies or allocated to a single band. Further, the disclosed embodiments utilize all available space, or bandwidth, in transmitting data. In other words, because the end result is an integrated stream of data, the data does not take up additional space on the pipe. Further, using single strands of data, such as integrated segment 120, creates more availability within the pipe and on the network to send more information using the same bandwidth. The disclosed embodiments may operate across existing POTS line, for example, a 56K bandwidth, by providing high speed and high capacity data exchange by diminishing the space need to transfer information. Further, the disclosed embodiments may diminish interference between coexisting or simultaneous broadcasts across the same line or pipe because the data is compressed into a single strand.

Further, compression according to the disclosed embodiments may occur according to different standards. For example, compression may occur according to the current two elements standard, such as 1 and 0. Data may be represented by these two elements, and that data may be compared, analyzed, and compressed into a single line of data that is transmitted over a network. Alternatively, data may be represented by differing standards having additional elements. For example, data may be represented by 32 elements. The disclosed embodiments may compress data different from the two elements standard as it analyzes the data during the compression operations 106. This feature may be known as fractal compression. The format of the data may not concern compression device 100. Thus, the disclosed embodiments are not limited by the type, format, or medium of the data to be compressed.

Figure 2:
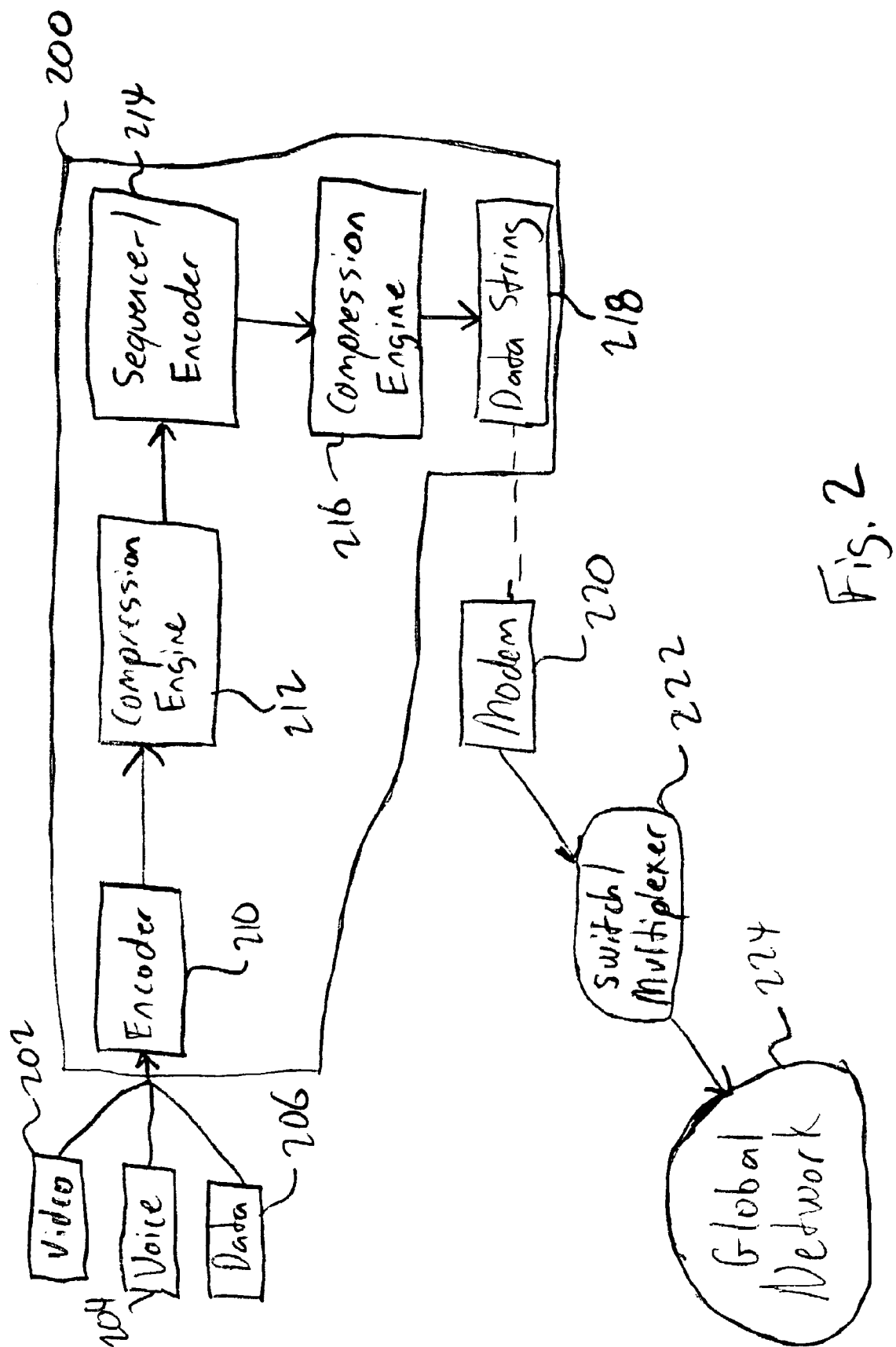
FIG. 2 illustrates a system for compressing and delivering data according to the disclosed embodiments.

FIG. 2 depicts a system 200 for compressing data in according to the disclosed embodiments of the present invention. System 200 may correlate to compression device 100 in FIG. 1. System 200 may be a device, machine, computer, network, and the like. System 200 implements the features disclosed above. System 200 may take data segments 202, 204, and 206. Data segments 202, 204, and 206 may be from alternate sources. For example, data segment 202 may be video, data segment 204 may be voice, and data segment 206 may be data, such as text. System 200 may compress data segments 202, 204, and 206 according to the common coded strand comparisons disclosed above. Common data, information, blocks or the like may be compressed into numerical powers by dropping the redundant information for the new coded information. Data string 218 may be created by braiding the remaining strands into one data stream. The stream may be broken into blocks or fed continuously into a source for modem broadcast, such as modem 220. Modem 220 may transmit the data stream of data string 218 to switch/multiplexer 222 and onto global network 224. By transmitting as a single data stream, the disclosed embodiments may be to achieve about 100:1 video compression out of modem 220.

System 200 is disclosed in greater detail below. Encoder 210 receives data segments 202, 204, and 206. Encoder 210 may encode the received data according to existing formats, or a format apparent to one skilled in the art. Preferably, encoder 210 encodes the received data to be compatible with compression engine 212. Compression engine 212 may compress the encoded data according to known compression operations. Compression engine 212 may perform the first round of compression on the data from data segments 202, 204, and 206.

Sequencer/encoder 214 prepares the data from compression according the embodiments disclosed above. The features of sequencer/encoder 214 are disclosed in greater detail with reference to FIG. 3. Sequencer/encoder 214, however, may assign values, symbols, or other designations to the data and code the data for compression engine 216.

Compression engine 216 compresses the data from encoder/sequencer 214. Multiple streams are taken together by system 200. Compression engine 216 compresses the data streams, or segments, by shrinking the streams like a pyramid into one strand of data, or data string 218. The one strand also may be shrunk into a series of elements that refer to positions in the data pyramid. Compression engine 216 may compress data by the number of streams times the number of similar elements times the powered encoded final bits. The result may be exponentially compressed information that is superior to current technologies. Further, if existing compression engines, such as compression engine 212, are used with multiple simultaneous strands, the disclosed embodiments may use the process of compression engine 216 to compress the compressed data.

For example, if you have a 10:1 compression of a still image in a single strand according to MPEG and another 10:1 compression of a still image is added, then the compression may be doubled to 20:1 by comparing the data strand and combining them into one integrated strand. The compressed images may still be further compressed by the powered common bits. Thus, system 200 may be added to existing compression architectures to improve compression techniques and to increase the bandwidth efficiency of transmitting data over global network 224.

System 200 may be implemented as a plug-in device that connects to a wireless or wired device. Preferably, system 200 may couple with other devices via a peripheral port or via infrared-based technologies. System 200 may be constructed into a plug-in device that has a microchip-operating environment with memory and caching, a broadcast and receive device, and built-in protocol stacks and standards. System 200 may come with an upgradeable software bundle the contains the appropriate encoder/decoder devices and players for various types of data information comprising video, data, voice, or any form of multi-media content. For example, system 200 may be embodied on a self-contained unit with its own power source and operating environment. Alternatively, system 200 may be embodied as software upgradeable to existing client devices with hardware additions on the network side. In addition, a chipset size addition may incorporate the disclosed embodiments to remove the plug-in requirement to mobile devices and wired units. Preferably, any plug-in device for system 200 may desire about 200 Kbytes of memory on the client device because most of the processing is performed with the plug-in device with the software present in the client device. System 200 also may include peripheral ports to allow for other plug-in devices, such as wireless headsets, printers, and the like. System 200 also may be hot swappable as to be plugged and unplugged from the client device as desired.

Figure 3:
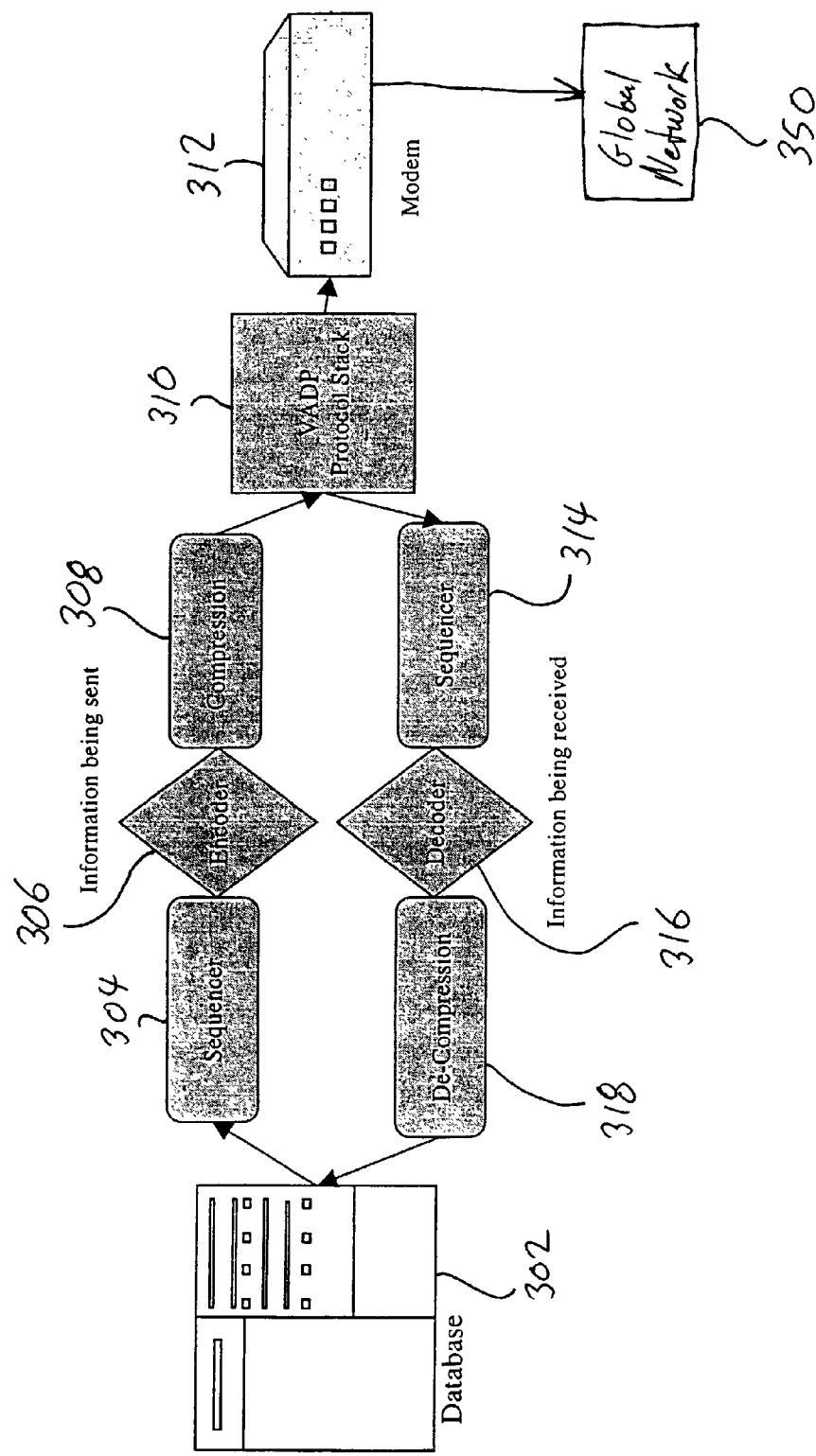
FIG. 3 illustrates a data exchange system according to the disclosed embodiments.

FIG. 3 depicts a data exchange system 300 according to the disclosed embodiments of the present invention. Data exchange system 300 may transmit and receive data over a network. Data exchange system 300 may code and compress data to be transmitted, and may decode and decompress data that is received. Data exchange system 300 may operate in conjunction with existing components to exchange data, such as the Internet, local area networks, wide area networks, and the like.

Data exchange system 300 may support an architecture using video, audio, data, protocol ("VADP"). Data exchange system 300 may incorporate current protocol stacks to ensure the usability of existing wireless devices. With new compression and delivery features, it may be desirable to have the information and data streams broadcast in a proper manner. The disclosed embodiments may utilize a protocol stack that combines the techniques, and encoding/decoding and broadcast sequencing for RF and wired networks. Thus, the disclosed embodiments do not replace the current standards, but works in conjunction with those standards to improve data exchanging by creating a new and more robust communication technique. By working in conjunction with existing architectures and devices, the disclosed embodiments should not be cost-prohibitive to implement on the network side, and allows affordable access on the client side. Thus, a broadband environment may be created for remote wired devices and wireless based communications.

Referring back to FIG. 3, data exchange system 300 includes a database 302. For networks and computers with increased processing power, such as desktop/laptop computers, database 302 may be advantageous. Database 302 may be part of a software bundle and functions as a dynamic collection toll for various sources of data and information. Database 302 may house a large variety of pre-coded information correlating to the compression algorithms used by data exchange system 300. The pre-coded information may not be available on wireless client devices because to the size and processing requirements. Database 302 may include a data storage program that allows for storage of compressed information. Database 302 also allows fro information to be taken directly and transmitted in pre-coded form. Database 302 also may learn patterns for the received data and may assemble the data accordingly, and operates as a dynamic collection tool for data exchange system 300.

Sequencer 304, encoder 306, and compression engine 308 comprise the architecture of data exchange system 300 to process information being sent to global network 350. Sequencer 304 acts as the primary coding element in compressing data within data exchange system 300. Sequencer 304 may assign numerical, powered, and symbol information to the data being processed and sends the powered coded information to encoder 306 for compression. A dynamic coding sequence may be utilized by classifying data by source, or medium. The sequence may be determined within the coding structure, and scenarios may be determined for transmission of the data in conjunction with intelligent resources, such as database 302.

Encoder 306 contains a knowledge base of programmed symbols for the entire color spectrum, as well as symbols for common language words, and data elements. This feature reduces the amount of processing. A data structure having common words, data, and color may be assigned a symbol and a sequence number to relative positions in the content. Preferably, encoding is not performed in segments such that the entire data representation may be captured. Three separate encoding mediums may exist: voice, or audio, video, and data. Each data bit may be coded separately according to the applicable medium. Further, coded data may be cataloged for future use, for example, by database 302.

The disclosed embodiments may utilize an intelligent coding system within encoder 306 to supplement the compression processing. The intelligent coding system may use a coding process as disclosed below. First, the data may be prioritized according to specially designed codes. Next, information may be assigned to a loop. Encoder 306 then may scan for pre-coded information. Tags and special encoding may be assigned based upon external feedback from external systems. The disclosed process may be fully automated to send code across a network versus actual data.

Compression engine 308 compress the data by powering according the disclosed embodiments, and moving the compressed data to the next line such that the old line may be "dropped." This process may be followed until a single powered line exists for compressed transfer via modem 312. VADP protocol stack 310 is used as disclosed above to prepare the compressed data for transmission using modem 312.

Sequencer 314, decoder 316, and de-compression engine 318 comprise the architecture of data exchange system 300 to process information received from global network 350. Global network 350 may provide compressed data to data exchange system 300. The compressed data should be converted back to its original form without significant transmission loss. According to the disclosed embodiments, minimal, if any, data loss occurs when the data is compressed into the single strand data.

Sequencer 314 may act like sequencer 304 disclosed above. Decoder 316 may carry the opposite code for the encoded data received from global network 350. Decoder 316 expands the compressed information back into its original data form. If the data was in a compressed format prior to compression by compression engine 308, such as MPEG, then the data is decompressed further using the decoding sequencing from that particular compression technology.

De-compression engine, or player, 318 receives the decode/decompressed data. Player 318 may include a processing unit, a memory set, an operating environment, and the peripheral equipment to complete the requested information. For example, if the data comprises a videophone call, then player 318 loads the protocols and encoding for voice and data. The information may be displayed on a screen.

Video compression using data exchange system 300 may be unique. The entire pixel spectrum of a resolution may be coded horizontally and vertically to capture all pixel layers. The pixels are sequentially coded as disclosed above, and allow for common color elements, and overlapping color elements to be captured, paired, sequenced, encoded, and then compressed. The entire picture spectrum may be captured and each data portion is cached to a single output string using sequencer 304, encoder 306, and compression engine 308. Colors, words, and common data are designated as pre-coded symbols for faster processing and may be a part of an intelligent network infrastructure and protocol stack. Database 302 may be used to collect information for further release and upgrades. For example, a website, or websites, visited by consumers may be analyzed and pre-coded. All the data, video, and voice/sound content is compressed into a single code strand that allows for less processing on subsequent visits, or by other consumers.

Using the disclosed embodiments, many applications may be utilized using the encoding and compression processes disclosed above. For example, video, audio, or any other data file may be delivered on-demand over existing networks having low bandwidth capabilities or wireless architectures. The data file may be encoded previously and stored in database 302. The data may have been assigned codes pertaining to the data from a previous encoding process. The encoded data then may be compressed according to the operations disclosed above. The result may be a single data string of the video, audio or data file that is transmitted over the network. The single data string may be stored at another location until the data is to be de-compressed and processed back through a player, such as player 318.

Existing systems may utilize the features of the disclosed embodiments by downloading or accessing a plug-in device storing the compression algorithms and encoding mechanisms disclosed above. This capability allows wireless laptop, phone, PDA and like configurations to receive the compressed data as a single strand of data, and to decompress the data back to its original form. Using the video on-demand example, a video file of a movie may be encoded and compressed according the disclosed embodiments. The compressed data may be transmitted over an existing wireless network using existing protocols and known transmission techniques. Because the bandwidth desired to carry the data is reduced, the data may be delivered over the wireless network without significant delay or consumption of bandwidth or other resources. The receiving device is able to download the data file in real-time, and the file is decompressed to allow the user to view the video. The process occurs without significant loss of data or backup in the "last mile" of the data delivery.

It will be apparent to those skilled in the art that various modifications can be made in the disclosed embodiments without departing from the spirit or scope of the invention. Thus, it is intended that the disclosed embodiments cover the modifications and variations of this invention provided that they come within the scope of any claims and their equivalents.

What is claimed:

1. A method for encoding data, the method comprising:
receiving a data segment;
accessing pre-coded information;
coding the data segment according to the pre-coded information; and generating a powered data segment from the coded data segment, wherein a bit of the powered data segment represents a plurality of bits from the data segment, wherein the coding step comprises coding the data segment using quantum states of the bit of the powered data segment.

2. The method of claim 1, wherein the using step comprises applying the pre-coded information, in which the pre-coded information corresponds to the quantum states.

3. The method of claim 2, further comprising arranging the quantum states of the bit according to the pre-coded information.

4. A method for encoding data, the method comprising:
receiving a data segment;
accessing pre-coded information;
coding the data segment according to the pre-coded information; and generating a powered data segment from the coded data segment, wherein a bit of the powered data segment represents a plurality of bits from the data segment,
further comprising transmitting the powered data segment and constructing a function from the pre-coded information.

5. The method of claim 4, further comprising evolving the function according to the generating step.

* * * * *